US 6,689,688 B2

(12) United States Patent
Besser et al.

(10) Patent No.: US 6,689,688 B2
(45) Date of Patent: Feb. 10, 2004

(54) METHOD AND DEVICE USING SILICIDE CONTACTS FOR SEMICONDUCTOR PROCESSING

(75) Inventors: Paul Raymond Besser, Sunnyvale, CA (US); Simon S. Chan, Saratoga, CA (US); David E. Brown, Austin, TX (US); Eric Paton, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/180,858

(22) Filed: Jun. 25, 2002

(65) Prior Publication Data
US 2003/0235984 A1 Dec. 25, 2003

(51) Int. Cl.$^7$ ................................ H01L 21/44
(52) U.S. Cl. .................... 438/682; 438/655; 438/664; 438/766; 438/769
(58) Field of Search ........................ 438/682, 630, 438/649, 651, 655, 659, 664, 766, 768, 769, 914, 514, 530, 533, 537

(56) References Cited

U.S. PATENT DOCUMENTS

| | | | |
|---|---|---|---|
| 5,950,098 A | 9/1999 | Oda et al. | |
| 6,180,469 B1 | 1/2001 | Pramanick et al. | |
| 6,380,057 B1 | 4/2002 | Buynoski et al. | |
| 6,413,859 B1 * | 7/2002 | Cabral et al. | 438/649 |
| 6,440,851 B1 * | 8/2002 | Agnello et al. | 438/682 |
| 6,444,578 B1 * | 9/2002 | Cabral et al. | 438/682 |
| 2002/0064918 A1 * | 5/2002 | Lee et al. | 438/300 |

OTHER PUBLICATIONS

P.S. Lee et al., "New Salicidation Technology With Ni(Pt) Alloy for MOSFETs", IEEE Electron Device Letters, vol. 22, No. 12, Dec. 2001, pp. 568–570.
C. Lavoie et al., "Effects of Alloying Elements on Cobalt Silicide Formation", IBM T.J. Watson Research Center, Yorktown Heights, NY, date unknown (2 pgs).
Hong–Xian Mo et al., "Formation and Properties of ternary silicide ($CO_xNI_{1-x}$)$Si_2$ thin films", IEEE 1998, pp. 271–274.
C. Detavernier et al., "Controlling $CoSi_2$ nucleation: the effect of entropy of mixing", Mat. Res. Soc. Symp. vol 611, 2000, Materials Research Society, 6 pgs.

* cited by examiner

Primary Examiner—Richard Elms
Assistant Examiner—Beth E. Owens
(74) Attorney, Agent, or Firm—Farjami & Farjami LLP

(57) ABSTRACT

A method for forming silicide contacts includes forming a layer on silicon-containing active device regions such as source, drain, and gate regions. The layer contains a metal that is capable of forming one or more metal silicides and a material that is soluble in a first metal silicide but not soluble in a second metal silicide, or is more soluble in the first metal silicide than in the second metal silicide. The layer may be formed by vapor deposition methods such as physical vapor deposition, chemical vapor deposition, evaporation, laser ablation, or other deposition method. A method for forming silicide contacts includes forming a metal layer, then implanting the metal layer and/or underlying silicon layer with a material such as that described above. The material may be implanted in the silicon layer prior to formation of the metal layer. Contacts formed include a first metal silicide and a material that is more soluble in a first metal silicide than in a second metal silicide. The contacts may be part of a semiconductor device including a substrate, active region containing silicon, and silicide contacts disposed over the active region and capable of electrically coupling the active region to other regions such as metallization lines.

26 Claims, 3 Drawing Sheets

METHOD AND DEVICE USING SILICIDE CONTACTS FOR SEMICONDUCTOR PROCESSING

CROSS REFERENCE TO RELATED APPLICATION

This application is related to the U.S. patent application Ser. No. 10/180,686, filed Jun. 25, 2002, titled "Method and Device Using Silicide Contacts for Semiconductor Processing," Eric Paton, Paul R. Besser, Simon S. Chan, David E. Brown, which is incorporated herein by reference in its entirety.

FIELD OF THE INVENTION

The present invention relates to the field of semiconductor device manufacturing. More particularly, it relates to the formation of silicides, including self-aligned silicides (salicides).

BACKGROUND

Silicides, which are compounds formed from a metal and silicon, are commonly used for contacts in semiconductor devices. Silicide contacts provide a number of advantages over contacts formed from other materials, such as aluminum or polysilicon. Silicide contacts are thermally stable, have lower resistivity than polysilicon, and provide for fairly Ohmic contacts. Silicide contacts are also reliable, since the silicidation reaction eliminates many defects at the interface between the contact and the device feature.

A common technique used in the semiconductor manufacturing industry is self-aligned silicide (salicide) processing. Salicide processing involves the deposition of a metal that undergoes a silicidation reaction with silicon (Si) but not with silicon dioxide or silicon nitride. In order to form salicide contacts on the source, drain, and gate regions of a semiconductor wafer, oxide spacers are provided next to the gate regions. The metal is then blanket deposited on the wafer. After heating the wafer to a temperature at which the metal reacts with the silicon of the source, drain, and gate regions to form contacts, non-reacted metal is removed. Silicide contact regions remain over the source, drain, and gate regions, while non-reacted metal is removed from other areas. Salicide processing is known in the art and described, for example, in commonly assigned U.S. Pat. No. 6,165,903, which is hereby incorporated by reference in its entirety.

Commonly used salicide materials include $TiSi_2$, $CoSi_2$, and NiSi. Although NiSi provides some advantages over $TiSi_2$ and $CoSi_2$, such as lower silicon consumption during silicidation, it is not widely used because of the difficulty in forming NiSi rather than the higher resistivity nickel di-silicide, $NiSi_2$. Even though back end of line (BEOL) temperatures below 500° C. can now be achieved, forming NiSi without significant amounts of $NiSi_2$ remains a challenge, since formation of $NiSi_2$ has been seen at temperatures as low as about 450° C. Therefore, a method which favors the formation of NiSi and disfavors the formation of $NiSi_2$ is desirable.

SUMMARY

According to an embodiment of the invention, a method for forming silicide contact regions on active device regions such as transistor source, drain, and gate regions favors the formation of a first silicide and disfavors the formation of a second silicide.

A first region comprising silicon is formed on a semiconductor substrate. A layer including a metal is formed on the first region, where the metal is capable of forming one or more metal silicides. A suitable material is ion implanted into the layer. A silicide disposed over the first region is formed by the reaction of the silicon with the metal. Prior to silicidation, substantially all of the implanted material may be in the layer, or at least a portion of the implanted material may be in the silicon underlying the layer.

According to an embodiment of the invention, the metal is capable of forming at least a first silicide and a second silicide. The material is soluble in the first silicide, but not the second silicide. In another embodiment, the material is more soluble in the first silicide than the second silicide. As a result, the first silicide is energetically preferred. In one embodiment, the metal is nickel (Ni), the first silicide is NiSi, and the second silicide is $NiSi_2$. The material may include an element chosen from the group consisting of germanium (Ge), titanium (Ti), rhenium (Re), tantalum (Ta), nitrogen (N), vanadium (V), iridium (Ir), chromium (Cr), and zirconium (Zr). The amount of material implanted is sufficient to energetically favor the first silicide but not so great that the material separates from the solid solution. For example, the material may be less than about 15 at. % of the silicide contact region, or between about 5 at. % and about 10 at. %.

After the material is implanted, the temperature of the substrate is raised in order to form a silicide over one or more active regions. The silicide provides a contact so that the active regions can be electrically coupled to other regions, such as metallization lines. The silicide may be a self-aligned silicide, or salicide. The active region may be a source region, drain region, or a gate region. After the silicide is formed, non-reacted metal is removed, for example, by a selective etch process.

According to another embodiment, the material is implanted into the active regions prior to the formation of the metal layer.

According to another embodiment, a layer is formed over silicon-containing active regions, where the layer includes a first material and a second material. The layer may be formed by vapor deposition, such as by evaporation, physical vapor deposition, chemical vapor deposition, laser ablation, or other deposition method.

The first material includes a metal that is capable of forming one or more silicide compounds. The second material may be a material that is soluble in a first silicide of the metal but not in a second silicide of the metal, so that the first silicide is energetically preferred. The second material may be more soluble in the first silicide than the second silicide, so that formation of the first silicide is energetically favored. In one embodiment, the metal is nickel, the first silicide is NiSi, and the second silicide is $NiSi_2$. The material may include an element chosen from the group consisting of Ge, Ti, Re, Ta, N, V, Ir, Cr, Ta, and Zr. The amount of the second material is sufficient to energetically favor the first silicide but not so great that the material separates from the solid solution. For example, the material may be less than about 15 at. % of the silicide contact region, or between about 5 at. % and about 10 at. %.

After the layer is formed, the temperature of the substrate is raised in order to form a silicide over one or more active regions. The silicide provides a contact so that the active regions can be electrically coupled to other regions, such as metallization lines. The silicide may be a self-aligned silicide, or salicide. The active region may be a source region, drain region, or a gate region. After the silicide is formed, non-reacted metal is removed, for example, by a selective etch process.

According to some embodiments of the invention, the silicidation process is a single step, where the temperature of the substrate is raised to a temperature sufficient to form the desired silicide. According to other embodiments, a multi-step process may be used. In a first step, the temperature of the substrate is raised to a first temperature, forming an initial silicide. In a second step, the temperature of the substrate is raised to a second temperature, forming a final silicide.

According to an embodiment of the invention a contact region comprises a first metal silicide and a first material. The first material may be soluble in the first metal silicide but not in a second metal silicide. Alternately, the first material may be more soluble in the first metal silicide than the second metal silicide, so that the first metal silicide is energetically favored. The first metal silicide may be NiSi and the second metal silicide may be $NiSi_2$. The first material may include an element chosen from the group consisting of Ge, Ti, Re, Ta, N, V, Ir, Cr, Ta, and Zr. The amount of the first material is sufficient to energetically favor the first silicide but not so great that the material separates from the solid solution. For example, the material may comprise less than about 15 at. % of the contact, or between about 5 at. % and about 10 at. %.

According to an embodiment of the invention, a contact such as that described above may be part of a semiconductor device, including a substrate with an active region such as a source, drain, or gate region, and a contact disposed over the active region, where the contact may be used to couple the active region to another region such as a metallization line.

A more complete understanding of embodiments of the present invention will be afforded to those skilled in the art, as well as a realization of additional advantages thereof, by a consideration of the following detailed description of one or more embodiments. Reference will be made to the appended drawing that will first be described briefly.

BRIEF DESCRIPTION OF THE DRAWINGS

Use of the same or similar reference numbers in different figures indicates the same or like elements.

DETAILED DESCRIPTION

Embodiments of the current invention provide for formation of a first silicide, such as NiSi, without the formation of significant amounts of a second silicide, such as $NiSi_2$.

Figure 1:
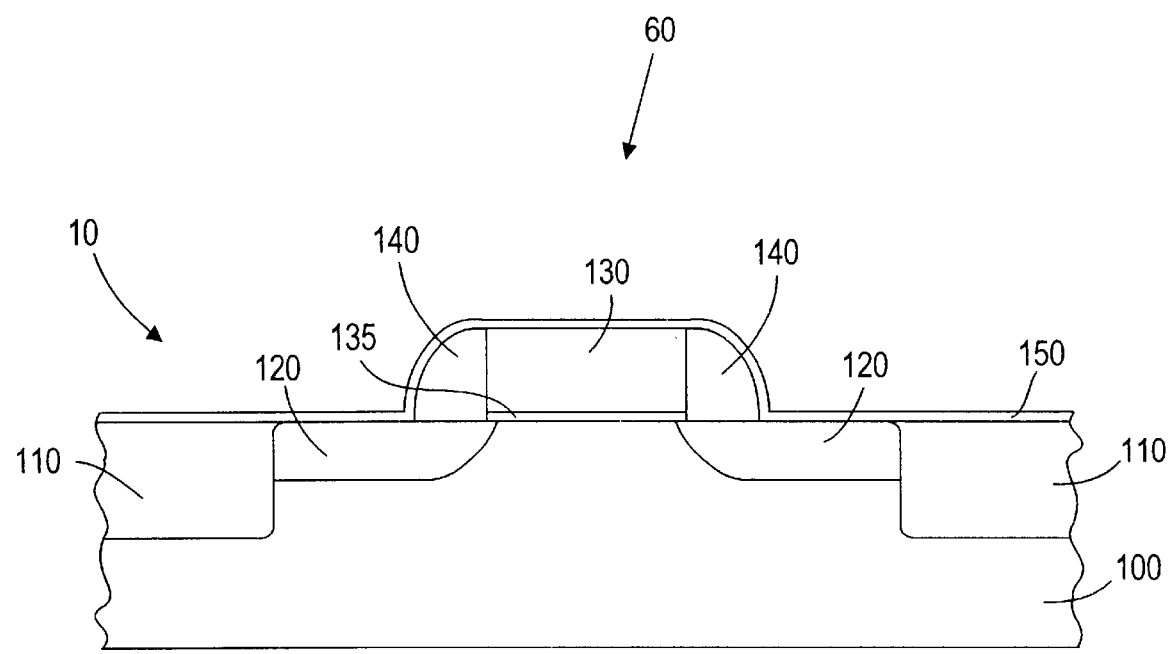
FIG. 1 shows a cross sectional view of a wafer undergoing a process for forming silicide contact regions, including implanting a material to disfavor the formation of one silicide and promote formation of a different silicide, according to an embodiment of the invention.

According to an embodiment of the invention, silicide regions are formed above active (e.g. transistor) regions on a semiconductor substrate. For example, silicide contacts are formed above the source, drain, and gate regions of a field effect transistor formed on a silicon substrate. In FIG. 1, a wafer 10 includes a substrate 100. Substrate 100 is a conventional crystalline silicon substrate, which may be doped p-type or n-type. Active regions 120 are, for example, transistor source regions or drain regions. Active regions 120 are conventionally isolated from active regions of other devices by field oxide regions 110. Oxide regions 110 may be formed by local oxidation of silicon (LOCOS) methods, or by shallow trench isolation (STI) methods, for example. Active regions 120 may be n-type or p-type doped silicon, and may be formed according to known methods.

A conventional gate region 130 is formed on a gate oxide 135. Gate region 130 may comprise doped polysilicon. Spacers 140, which may be oxide spacers, are formed next to the sidewalls of gate region 130. A metal layer 150 is deposited over the surface of wafer 10. According to an embodiment of the invention, metal layer 150 comprises nickel, although other metals may be used.

A material 60 is conventionally implanted into metal layer 150 (for details see below). The temperature is then raised, leading to the silicidation reaction. During silicidation, silicon from active regions 120 and gate region 130 diffuses into metal layer 150 and/or metal from metal layer 150 diffuses into silicon-containing active regions 120 and gate region 130. One or more metal silicide regions form from this reaction. When metal layer 150 includes a metal that forms a silicide with elemental silicon (crystalline, amorphous, or polycrystalline), but not with other silicon-containing molecules (like silicon oxide or silicon nitride), the silicide is termed a salicide, a self-aligned silicide.

After the silicidation, the non-reacted metal is removed; for example, by a selective etch process. In an embodiment where metal layer 150 comprises nickel, non-reacted nickel on the wafer may be removed by wet chemical stripping. The wafer may be immersed into a solution of $H_2SO_4$, $H_2O_2$ and water (known as SPM) or a solution of $NH_4OH$, $H_2O_2$ and water (known as APM). According to one embodiment, non-reacted nickel is removed by immersing the wafer in a 1:1:10 APM solution at about 20° C. (or higher; for example, up to about 80° C.) for about six minutes, followed by immersing the wafer in a 7:1 SPM solution at about 20° C. (or higher) for about ten minutes. The order in which the wafer is immersed may be reversed. After removal of the non-reacted metal, the remaining silicide regions provide electrical contacts for coupling the active regions and the gate region to other features on the wafer such as metallization lines.

According to an embodiment of the invention, material 60 is such that it is soluble in a first silicide of a metal included in metal layer 150, but not soluble in a second silicide of a metal included in metal layer 150. Alternately, the material 60 may be more soluble in the first silicide than in the second silicide, as long as the difference in solubility is sufficient to energetically favor formation of the first silicide over the second silicide.

For example, if metal layer 150 includes nickel, a number of different silicides may be formed, including NiSi and $NiSi_2$. NiSi is preferred over $NiSi_2$ as a contact material because its sheet resistance is lower, and because formation of NiSi consumes much less silicon than the formation of $NiSi_2$. However, it is difficult to prevent the formation of $NiSi_2$, since $NiSi_2$ has been shown to form at temperatures as low as about 450° C., while the temperature required to form NiSi is about 320° C.

Implanting a material that is soluble in NiSi but not in $NiSi_2$ thermodynamically disfavors the formation of $NiSi_2$, because the Gibbs free energy of the NiSi/implanted material solution is lower than the Gibbs free energy of a separated mixture of $NiSi_2$ and the implanted material.

Figure 2A:
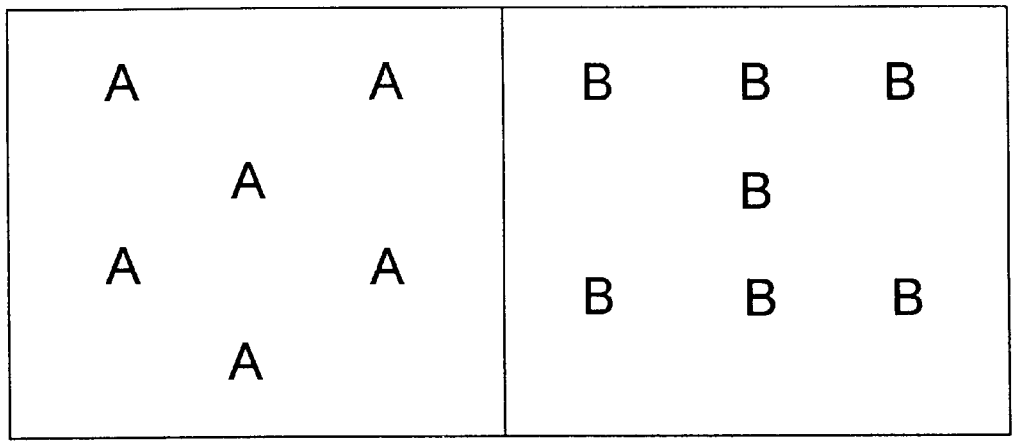
FIGS. 2A and 2B illustrate a two-component system whose Gibbs free energy differs by an amount equal to the entropy of mixing.

As a simple illustration, consider the case of two materials, A and B, which are kept in separate volumes, as shown in FIG. 2A. For an internal energy U, pressure P, volume V, temperature T, and entropy S, the Gibbs free energy, G, is equal to:

$$G = U + PV - TS \quad \text{Equation 1}$$

For $n_A$ molecules of material A with free energy $G_A^0$ per molecule, and $n_B$ molecules of material B with free energy $G_B^0$ per molecule, the free energy of the system may be expressed as:

$$G = n_A G_A^0 + n_B G_B^0 \quad \text{Equation 2}$$

If we define x as the fraction of molecules that are molecules of material B:

$$x = \frac{n_B}{n_A + n_B} \quad \text{Equation 3}$$

then G may be rewritten as:

$$G = (1-x)G_A^0 + xG_B^0 \quad \text{Equation 4}$$

Figure 2B:
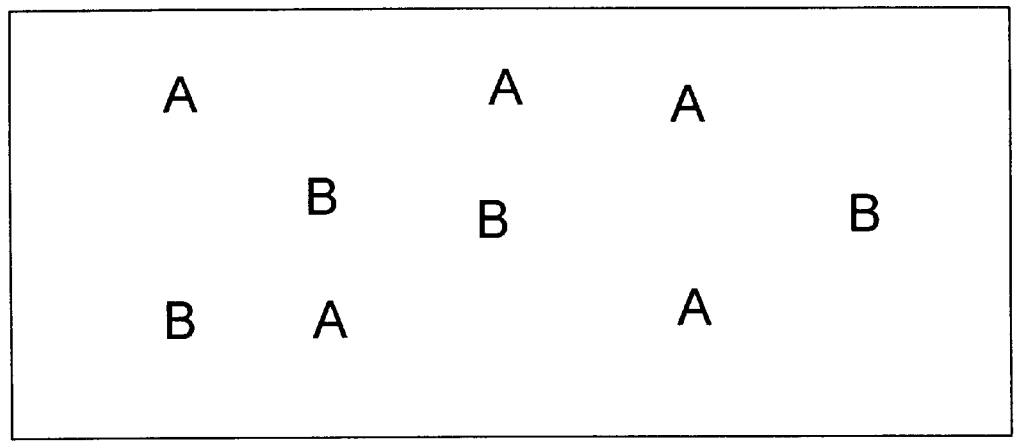

FIG. 2B shows the case where the two materials A and B are allowed to mix. For the simple case of no change of U or V on mixing, the change in the free energy when materials A and B are allowed to mix is just equal to the entropy of mixing times the temperature, where $$\Delta S_{mix} = -R[x \ln x + (1-x) \ln(1-x)] \quad \text{Equation 5}$$

which results in a change in the free energy as follows:

$$G = (1+x)G_A^0 + xG_B^0 + RT[x \ln x + (1-x) \ln(1-x)] \quad \text{Equation 6}$$

Note that since x<1, the Gibbs free energy of the mixture is less than the free energy of the separated materials. Therefore, by implanting a material that is soluble in NiSi but not soluble in $NiSi_2$, the formation of NiSi is energetically favored.

According to an embodiment of the invention, metal layer 150 comprises nickel, and material 60 comprises Ge, Ti, Re, Ta, N, V, Ir, Cr, Zr, or other appropriate material that has the characteristics described above. The amount of material 60 that is implanted is sufficient to energetically disfavor the formation of $NiSi_2$, but not so great that the material separates from the solid solution. For example, the material may be less than about 15 at. %, or between about 5 at. % and about 10 at. % of the metal layer 150.

Table 1 lists implant beam energies to form up to about 300 Å NiSi thickness, at a Si implant depth of about 150 Å. For a case where the material is about 10 at. % of metal layer 150, the implant dose would be about $1 \times 10^{18}$ cm$^{-2}$. Where the material is about 15 at. % of metal layer 150, the implant dose would be about $1.5 \times 10^{18}$ cm$^{-2}$. For high doses such as these, plasma immersion ion implantation may provide a greater throughput than beam-line ion implantation, although either (or other) method may be used.

TABLE 1

| Material | Implant beam energy |
|---|---|
| V | About 5 keV or less |
| Ge | About 6.5 keV or less |
| Ir | About 7 keV or less |

TABLE 1-continued

| Material | Implant beam energy |
|---|---|
| Ti | About 5 keV or less |
| Cr | About 5 keV or less |
| Ta | About 8 keV or less |
| Re | About 8.5 keV or less |
| Zr | About 7 keV or less |

Material 60 may be implanted into silicon regions such as gate 130 and active regions 120, or into metal layer 150. Material 60 may be implanted into the silicon regions before or after the formation of metal layer 150. Material 60 may be implanted into both metal layer 150 and the silicon regions, as long as the amount is sufficient to make formation of a first silicide energetically preferable to the formation of a second silicide.

Figure 3:
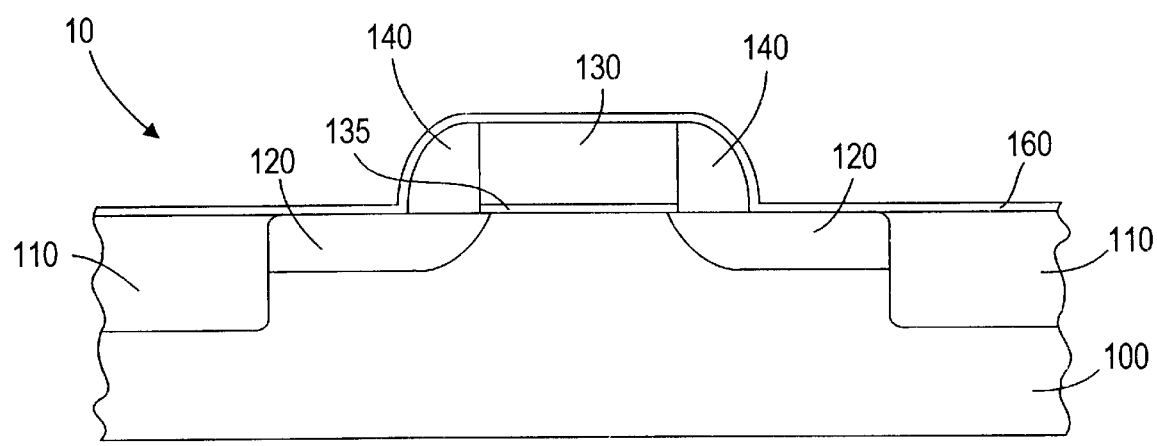
FIG. 3 shows a cross sectional view of a wafer undergoing a process for forming silicide contact regions, including forming a layer including a metal and an additional material to disfavor the formation of one silicide and promote formation of a different silicide, according to an embodiment of the invention.

According to another embodiment of the invention, FIG. 3 shows a wafer 10 including a substrate 100. Similar to the embodiment shown in FIG. 1, substrate 100 is a crystalline silicon substrate, which may be doped p-type or n-type. Active regions 120, which may be source regions or drain regions, are isolated from active regions of other devices by an oxide regions 110. Oxide regions 110 may be formed by local oxidation of silicon (LOCOS) methods, or by shallow trench isolation (STI) methods, for example. Active regions 120 may be n-type or p-type doped silicon, and may be formed according to known methods.

A gate region 130 is formed on a gate oxide 135. Gate region 130 may conventionally comprise doped polysilicon. Spacers 140, which may be oxide spacers, are formed next to gate region 130. A layer 160 is deposited (details below) over the surface of wafer 10. Layer 160 includes a metal capable of forming a silicide and an additional material. The metal may be capable of forming a first silicide and a second silicide, and the additional material may be soluble in the first silicide but not the second silicide.

For example, the metal may be nickel, and the material may be soluble in NiSi but not in $NiSi_2$, so that the formation of $NiSi_2$ is energetically disfavored, allowing for more reliable production of NiSi contacts. The additional material may be Ge, Ti, Re, Ta, N, V, Ir, Cr, Zr, or other appropriate material.

Layer 160 may be formed by a number of methods. For example, layer 160 may be deposited using a vapor deposition process. Vapor deposition includes, but is not limited to evaporation, physical vapor deposition, and laser ablation. According to an embodiment of the invention, layer 160 is deposited by physical vapor deposition using a sputter target. The sputter target comprises the metal and the additional material in the proportions to be used to prevent formation of $NiSi_2$. The proportion of additional material in the sputter target is large enough to be effective, yet not so large that the additional material separates out of the solid solution. For example, where the metal is nickel and where the additional material chosen from the group Ge, Ti, Re, Ta, N, V, Ir, Cr, Ta, and Zr, the proportion of additional material may be less than about 15 at. %, or between about 5 at. % and about 15 at. %.

To deposit layer 160, wafer 10 is introduced into a sputter chamber. Material is conventionally sputtered from the sputter target and forms layer 160 on wafer 10. After layer 160 is formed on wafer 10, the temperature of wafer 10 is increased to form a silicide by the reaction of silicon with one or more metallic constituents of layer 160. The silicidation process is described more fully below.

In some embodiments of the invention, silicidation is performed using a single rapid thermal anneal (RTA) step.

During the RTA, the temperature of the wafer is raised to a temperature sufficient to form the desired silicide; for example to form NiSi. In other embodiments, a two step process is performed.

An embodiment of a two-step silicidation process for forming NiSi contact regions is as follows. During a first RTA, the temperature is raised to between about 320° C. and about 450° C., for a time of about 5 seconds to about 60 seconds. A di-nickel silicide $Ni_2Si$ is formed during the first RTA, at a temperature low enough that silicon does not diffuse up spacers such as spacers 140 of FIG. 1 and FIG. 3, which may cause short circuits in the device. After the first RTA, a selective etch is performed which removes unreacted metallization (for example, portions of metal layer 150 of FIG. 1 or layer 160 of FIG. 3 disposed above spacers 140, oxide regions 110, and other non-silicon regions of wafer 10). A second RTA is then performed, during which the temperature is raised to between about 400° C. and about 550° C., for a time of about 5 seconds to about 60 seconds. The low resistance NiSi phase is formed during the second RTA.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method of semiconductor processing, comprising the acts of:
   forming a first region on a semiconductor substrate, said first region comprising silicon;
   forming a layer on said first region, said layer comprising a metal, said metal capable of forming a first silicide and a second silicide;
   implanting a material into said layer, said material causing formation of said first silicide to be thermodynamically favored over formation of said second silicide; and
   forming said first silicide disposed over said first region by the reaction of the silicon with said metal.

2. The method of claim 1, wherein said material is more soluble in said first silicide than in said second silicide.

3. The method of claim 2, wherein said metal comprises nickel, said first silicide comprises NiSi, and said second silicide comprises $NiSi_2$.

4. The method of claim 1, wherein said metal comprises nickel.

5. The method of claim 4, wherein said material includes an element chosen from the group consisting of Ge, Ti, Re, Ta, N, V, Ir, Cr, and Zr.

6. The method of claim 1, wherein said forming said first silicide comprises raising the temperature of said semiconductor substrate.

7. The method of claim 1, wherein said first silicide comprises a contact, said contact configured to provide electrical contact with said first region.

8. The method of claim 1, wherein said first silicide is a self-aligned silicide.

9. The method of claim 1, wherein said first region comprises a region selected from a source region, a drain region, and a gate region.

10. The method of claim 1, wherein said material is less than about 15 at. % of said first silicide.

11. The method of claim 1, wherein said material is between about 5 at. % and about 10 at. % of said first silicide.

12. The method of claim 1, wherein after said implanting, substantially all of said material is distributed within said layer.

13. The method of claim 1, wherein after said implanting, at least a portion of said material is distributed in said first region.

14. A method of semiconductor processing, comprising the acts of:
   forming a first region on a semiconductor substrate, said first region comprising silicon;
   implanting said first region with a material;
   forming a layer on said first region, said layer comprising a metal, said metal capable of forming a first silicide and a second silicide, said material being more soluble in said first silicide than in said second silicide such that formation of said first silicide is thermodynamically favored over formation of said second silicide;
   and
   forming first silicide over said first region by the reaction of the silicon with said metal.

15. The method of claim 14, wherein said metal comprises nickel, said first silicide comprises NiSi, and said second silicide comprises $NiSi_2$.

16. The method of claim 14, wherein said metal comprises nickel.

17. The method of claim 16, wherein said material includes an element chosen from the group consisting of Ge, Ti, Re, Ta, N, V, Ir, Cr, and Zr.

18. The method of claim 14, wherein said forming said first silicide comprises raising the temperature of said first region.

19. The method of claim 14, wherein said first silicide comprises a contact, said contact configured to provide electrical contact with said first region.

20. The method of claim 14, wherein said first silicide is a self-aligned silicide.

21. The method of claim 14, wherein said first region comprises a region selected from a source region, a drain region, and a gate region.

22. The method of claim 14, wherein said material is less than about 15 at. % of said first silicide.

23. The method of claim 14, wherein said material is between about 5 at. % and about 10 at. % of said first silicide.

24. A method of semiconductor processing, comprising the acts of:
   forming a first region on a semiconductor substrate, said first region comprising silicon;
   forming a layer on said first region, said layer comprising a metal, said metal capable of forming a first silicide and a second silicide;
   implanting a material into said layer, said material being more soluble in said first silicide than in said second silicide; and
   forming said first silicide disposed over said first region by the reaction of the silicon with said metal;
   wherein said metal comprises nickel, said first silicide comprises NiSi, and said second silicide comprises $NiSi_2$.

25. A method of semiconductor processing, comprising the acts of:
- forming a first region on a semiconductor substrate, said first region comprising silicon;
- forming a layer on said first region, said layer comprising a metal, said metal capable of forming one or more silicides;
- implanting a material into said layer; and
- forming a silicide disposed over said first region by the reaction of the silicon with said metal;
- wherein said material is less than about 15 at. % of said silicide.

26. A method of semiconductor processing, comprising the acts of:
- forming a first region on a semiconductor substrate, said first region comprising silicon;
- implanting said first region with a material;
- forming a layer on said first region, said layer comprising a metal, said metal capable of forming one or more silicides; and
- forming a silicide over said first region by the reaction of the silicon with said metal;
- wherein said material is less than about 15 at. % of said silicide.

* * * * *